United States Patent [19]

Thompson et al.

[11] 4,213,808

[45] Jul. 22, 1980

[54] FABRICATION OF INJECTION LASERS UTILIZING EPITAXIAL GROWTH AND SELECTIVE DIFFUSION

[75] Inventors: George H. B. Thompson, Sawbridgeworth; David F. Lovelace, Waltham Abbey, both of England

[73] Assignee: ITT Industries, Incorporated, New York, N.Y.

[21] Appl. No.: 891,886

[22] Filed: Mar. 30, 1978

[30] Foreign Application Priority Data

Apr. 1, 1977 [GB] United Kingdom ............... 13957/77

[51] Int. Cl.² ................. H01L 21/225; H01L 21/205; H01L 33/00
[52] U.S. Cl. .................................... 148/188; 148/175; 148/187; 331/94.5 H; 357/16; 357/17; 357/18
[58] Field of Search .................. 148/175, 188, 187; 357/16, 17, 18; 331/94.5 H

[56] References Cited

U.S. PATENT DOCUMENTS

| | | | |
|---|---|---|---|
| 3,352,725 | 11/1967 | Antell | 148/188 X |
| 3,728,784 | 4/1973 | Schmidt | 148/188 X |
| 3,733,561 | 5/1973 | Hayashi | 331/94.5 H |
| 3,783,351 | 1/1974 | Tsukada et al. | 148/175 X |
| 3,856,588 | 12/1974 | Hashimoto et al. | 148/188 |
| 3,907,616 | 9/1975 | Wiemer | 148/188 |
| 3,911,376 | 10/1975 | Thompson | 331/94.5 H |
| 3,920,491 | 11/1975 | Yonezu | 148/187 X |
| 3,982,261 | 9/1976 | Antypas | 148/175 X |
| 4,011,113 | 3/1977 | Thompson et al. | 148/175 |
| 4,105,955 | 8/1978 | Hayashi et al. | 357/18 X |

OTHER PUBLICATIONS

Dumke, W. P., "Simple Planar Double-Heterojunction Laser Structure", I.B.M. Tech. Discl. Bull., vol. 16, No. 4, Sep. 1973, p. 1186.
Smith et al., "Lattice Matched Double Heterojunction . . . Operation", Ibid., vol. 16, No. 11, Apr. 1974, pp. 3808-3809.
Tsukada, T., "GaAs-GaAlAr Buried-Heterostructure Injection Laser", J. Applied Physics, vol. 45, No. 11, No. 1974, pp. 4899-4906.

*Primary Examiner*—L. Dewayne Rutledge
*Assistant Examiner*—W. G. Saba
*Attorney, Agent, or Firm*—John T. O'Halloran; Peter C. Van Der Sluys

[57] ABSTRACT

Porous silica doped with zinc is used as a p-type dopant source in the construction of rib lasers. This is preferable to the method used in the parent case of growing a zinc doped layer because epitaxial growth is liable to be accompanied by zinc diffusion into regions where it is not required. Other modifications include allowing the zinc diffusion to go right through the active layer and to dimension the device so that lateral optical guidance is unaffected by the rib.

6 Claims, 13 Drawing Figures

(a)

(b)

(c)

(d)

FABRICATION OF INJECTION LASERS UTILIZING EPITAXIAL GROWTH AND SELECTIVE DIFFUSION

This invention relates to injection lasers, and is particularly concerned with the manufacture of double heterostructure injection lasers of III-V material by a method which involves the diffusion of a mobile dopant to cause a strip of a p-n junction, previously entirely bounded on both sides by higher band-gap material, to be translated into or through an active layer of lower band-gap material. As a result of this diffusion the active layer is provided with a stripe of one conductivity type separated from the remainder by a p-n junction that in regions remote from the stripe is bounded on both sides by higher band-gap material. Under appropriate conditions this configuration of intersecting p-n and heterojunctions can provide a current flow across the p-n junction which is confined virtually exclusively to the region or regions where it forms a boundary of the stripe in the active region.

According to the present invention there is provided a method of making a double heterostructure injection laser of III-V material, the method including the steps of forming by epitaxial growth a double heterostructure with an active layer sandwiched between upper and lower layers of higher band-gap material, wherein the upper layer contains a p-n junction dividing a lower part having the same conductivity type as that of the active layer and the lower layer from an upper part having the opposite conductivity type, of delineating a stripe on the upper surface of the semiconductive material, and of diffusing through said stripe a conductive type determining dopant of the type opposite that of the active layer and of greater mobility than that used in the provision of the three layers of the heterostructure so as to cause the region of the p-n junction underlaying the stripe to be translated downwardly to halt either within the active layer, or at the heterojunction between the active layer and the lower layer, or within the lower layer.

In the foregoing reference has been made to the active layer, and this has been identified as being made of lower band-gap material than that of the two layers between which the active layer is sandwiched. It should be noted however that the active layer does not necessarily have the same composition throughout. In particular the active layer may itself be formed by a three layer structure comprising a central layer of low band-gap material sandwiched between two layers of slightly higher band-gap material. All three layers of such an active layer are however made of material of lower band-gap than that of the higher band-gap layers between which the active layer is sandwiched. The use of a composite active layer of this type enables some separation of the functions of optical confinement and minority carrier confinement in the directional normal to the plane of the active layer. This is set out in greater detail in U.K. Pat. No. 1,263,835 to which attention is directed.

There follows a description of the manufacture of double heterostructure $Ga_{1-x}Al_xAs$ injection lasers ($x \geq 0$) embodying the invention in preferred forms. It should be clearly understood however that the invention is not restricted to the $Ga_{1-x}Al_xAs$ system but is applicable to other semiconductors including other ternary compound semiconductors such as $Ga_{1-x}In_xAs$ and quaternary compound semiconductors such as $Ga_{1-x}In_xAs_{1-y}P_y$. The description refers to the drawings accompanying the Provisional Specification in which.

Figure 1A:
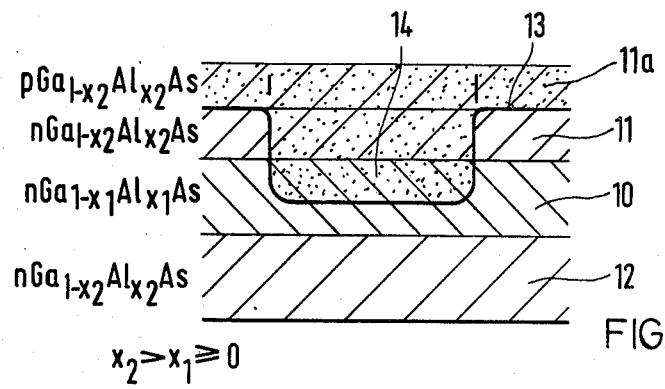
FIGS. 1a, 1b, 1c depict the central portion of three variants of double heterostructure laser.
Figure 1B:
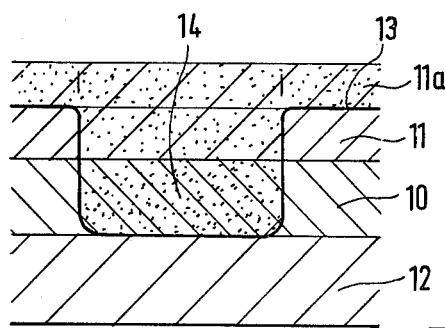
Figure 1C:
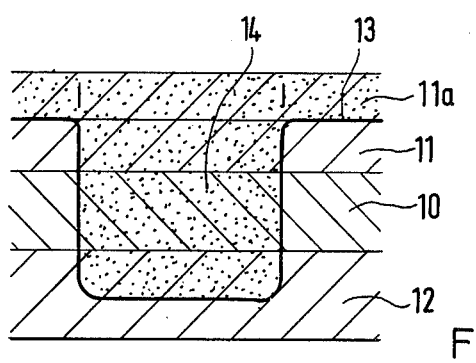

FIGS. 1a, 1b and 1c depict the central portion of three variants of lasers according to the present invention. Each has an active layer 10 of n-type lower band-gap $Ga_{1-x_1}Al_{x_1}As$ material, where $x_1 \geq 0$ sandwiched between upper and lower layers 11 and 12 of n-type higher band-gap $Ga_{1-x_2}Al_{x_2}As$ material, where $x_2 > x_1$. Layer 11 is covered with a p-type layer 11a, also of the higher band-gap material. Into each of these structures zinc has been diffused along a stripe extending in the direction of the laser, and, by converting some of the originally n-type material, this diffusion has produced a depression in the p-n junction 13 formed between layers 11 and 11a. This depression of the p-n junction may extend only part of the way through the active layer, as in FIG. 1a; it may extend all the way through the active layer, as in FIG. 1b; or it may extend through the active layer and into, but not through, the lower layer 12, as shown in FIG. 1c. The zinc diffusion thus produces a stripe 14 of p-type material within the active layer. The p-n junction 13 is bounded on to one or both sides by the lower band-gap material where it lies at the boundary of the stripe 14. Elsewhere within the region shown by these Figures the p-n junction is bounded on both sides by higher band-gap material.

When such a device is forward biased by a small amount, the current will flow across the junction almost exclusively through the region where it lies in the lower band-gap material. This is because the voltage drop across the p-n junction is smaller there than elsewhere. With increasing bias there may come the condition that the series resistance in the region of current flow produces a potential drop equal to the difference in band-gap. When this occurs current will begin to flow across other parts of the junction if the resulting current flow is not subject to the same potential drop. Therefore within the region shown by the FIGS. 1a, 1b, and 1c there is good current confinement at a small forward bias, but as the bias is increased the shape of the p-n junction may not alone be adequate to confine the current flow across the p-n junction to region of stripe 14. If, in a region remote from the stripe 14, the p-n junction were to be bounded only on one side by the higher band-gap material, the current confinement provided by the p-n junction will be less effective than if it were bounded on both sides by the higher band-gap material. It is for this reason that it is arranged for the p-n junction to be everywhere, except at the boundary of the stripe 14, bounded on both sides by the higher band-gap material. Normally the higher band-gap material of the lower layer 12 will be grown on a GaAs substrate, in which case the zinc diffusion must not be allowed to take the p-n junction right through the lower layer 12 and into the substrate. If the p-n junction were to penetrate the substrate material it would have the effect of providing another region of current confinement in parallel with that of the stripe 14. If the active layer was made of GaAs the current confinement regions would have similar impedances, but if the active layer were to contain some AlAs the region of the p-n junction in the substrate material would have the lower impedance, and hence would present a kind of short-circuit across the stripe 14.

Figure 2A:
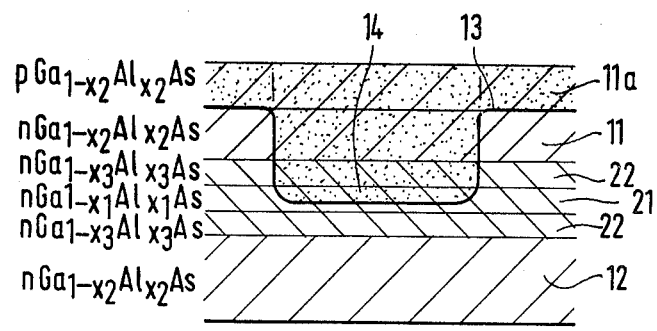
FIGS. 2a, 2b, 2c depict the central portion of three further variants of double heterostructure laser.
Figure 2B:
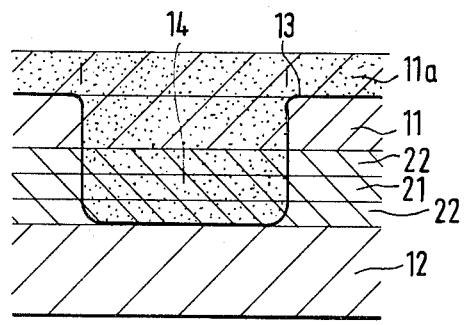
Figure 2C:
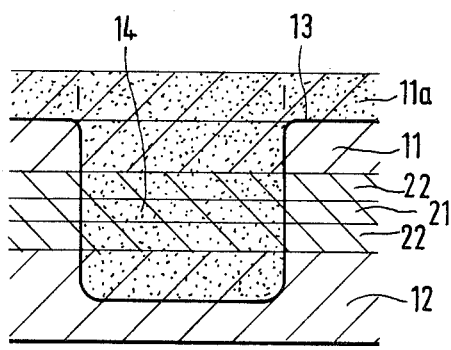

Referring to FIGS. 2a, 2b, and 2c the active layer does not necessarily have to be of uniform composition, but may, for instance, for reasons set out in U.K. Pat. No. 1,263,835 have a central layer of $Ga_{1-x_1}Al_{x_1}As$ sandwiched between two layers 22 of $Ga_{1-x_3}Al_{x_3}As$, all three layers having a lower band-gap than that of the higher band-gap layers 11 and 12 (i.e. $x_2 > x_3 > x_1 > 0$). In a typical structure $x_1 = 0.05$, $x_3 = 0.1$, and $x_2 = 0.4$.

FIGS. 3a to 3c depict successive stages in one method of making a laser according to the present invention. The laser is constructed from a slice (FIG. 3a) consisting of five layers 31 to 35 epitaxially grown upon a substrate 30 of n-type GaAs, typically having a carrier concentration of about $10^{18}$ cm$^{-3}$.

The active layer is layer 32, and is made of n-type $Ga_{1-x_1}Al_{x_1}As$, where $x_1$ is typically 0.05. The choice of carrier concentration for this layer is a compromise. A high carrier concentration is desirable because this produces good electron injection into that portion of the layer which is later going to be converted into p-type material. However a high carrier concentration also produces a large refractive index difference and for many applications this is undesirable because an increase in index difference requires the use of a corresponding reduction in stripe width of the p-type region in order to maintain single mode operation. If the stripe is narrow less compromise need be made and for a stripe width of around 4 µm a carrier concentration of the order of $2 \times 10^{18}$ cm$^{-3}$ is suitable.

A carrier concentration of about $5 \times 10^{17}$ cm$^{-3}$ may be used for layers 33 and 31. Both these layers are made of $Ga_{1-x_2}Al_{x_2}As$, where $x_2$ is typically 0.35, and both are made of n-type material. Layer 31 is the lower layer of higher band gap material of the heterostructure, and is typically a relatively thick layer 3–4 µm thick so as to provide a substantial margin for error in the termination of the subsequent p-type diffusion without risk of the p-n junction penetrating into the underlying substrate 30. If desired the carrier concentration of this lower layer 31 may be increased to around $2 \times 10^{18}$ cm$^{-3}$, thereby tending to arrest the translation of the p-n junction at the upper surface of this layer.

Layers 34 and 35 are both of p-type material and, except for conductivity type doping, typically has the same composition as the underlying upper higher band-gap layer 33. The carrier concentrations of layers 33 and 34 are also typically about the same value, while that of layer 35, which is provided for making contact with, has a higher carrier concentration to facilitate contacting, and typically has a carrier concentration of about $2 \times 10^{19}$ cm$^{-3}$. Layer 35, which is made of GaAs, is typically about 1 µm thick. Layers 33 and 34 are together also about 1 µm thick, or slightly greater, in order to provide adequate spacing of the optically absorbing high carrier concentration layer 35 from the active layer without introducing excessive series resistance. Layers 33 and 34 form respectively the lower and upper parts of the upper layer of higher band-gap material of the heterostructure.

According to the one method of fabrication the top surface of the slice is provided with an impervious masking layer 36 of, for instance, radio frequency deposited silica. Standard photolithographic techniques are used to etch with hydrofluoric acid a slot 37 through the silica masking layer 36 to expose the underlying semiconductive material. (For illustrative convenience FIGS. 3a to 3c and 4a to 4d depict a slice having only one slot. Only one slot is necessary for the manufacture of a single laser, but in accordance with normal semiconductor device manufacture practice, it is generally preferred to make lasers in batches, and for this purpose the slice will normally be provided with an array of slots in order to allow the manufacture of an array of lasers on a single slice.)

The next process step consists of diffusing a highly mobile p-type dopant such as zinc or magnesium in through the slot to cause the portion of the p-n junction underlying the slot to be translated downwardly into or through the active layer. Various methods can be used for carrying out the diffusion which differ in the way in which the zinc is introduced into the system, in the partial pressures of arsenic and gallium maintained in the diffusion chamber and in whether or not an atmosphere of inert gas, e.g. hydrogen, is also provided. The preferred diffusion source for the zinc consists of a quantity of gallium in which an amount in the range 0.1 to 20 atomic % of zinc is dissolved together with enough arsenic to give a saturated solution at the temperature concerned. Such a source can be used for diffusion at 850° C. It provides a relatively low arsenic partial pressure which increases the mobility of the zinc in the semiconductor so that it can be diffused at sufficient speed even at low concentration for which its diffusion rate in (GaAl)As is generally low. An alternative diffusion source consists either of $ZnAs_2$ or of the appropriate proportions of zinc and arsenic. This provides a high concentration of zinc in the semiconductor which diffuses rapidly so that the diffusion can be carried out at about 650° C. However in order to reduce the zinc concentration at the diffusion front to the level required for the satisfactory functioning of the laser, the diffusion must be followed by a second heat treatment at about 950° C. with no zinc present and of sufficient duration to move the zinc diffusion front forwards by about another micron. This treatment reduces the concentration of the zinc by the required amount.

Both types of diffusion process together with the anneal process can be carried out either in an evacuated and sealed silica capsule or in a reasonably leak-tight graphite container in a hydrogen atmosphere. According to the former method the source material is placed at one end of a silica capsule and the slice at the other. A small piece of silicon is placed in the capsule which is then evacuated and sealed. The silicon is included as a kind of 'getter' for any evolved oxygen. Diffusion is then promoted by placing the sealed capsule in a furnace arranged to take the source material end to a slightly higher temperature than the end containing the slice. This diffusion causes the underlying portion of the p-n junction formed between layers 33 and 34 to be translated downwardly in an approximately U-shaped channel 38 (FIG. 3b). The diffusion is terminated when the bottom of this channel has reached the desired position relative to the heterojunction between layers 31 and 32.

When the diffusion has been completed a metal contact layer 39 (FIG. 3c) is deposited by evaporation on to the surface of the silica mask and into its slot 37 to make contact with the underlying p-type material of layer 35.

According to another method of fabrication the top surface of the slice is provided with a porous layer of, for instance, pyrolitically deposited silica, into which an appropriate concentration of zinc is incorporated by diffusion or other means. Standard photolithographic techniques are used to remove subsequently with hydrofluoric acid the majority of this silica layer except for narrow stripes under which the lasers are to be formed. The slice with the silica stripes is then given a heat treatment at about 850° C. for the appropriate time to cause the zinc to diffuse out of the silica stripes and into the semiconductor for the required distance. The surface of the slice is then electrically insulated by laying down, for instance, a second silica layer, into which windows are opened by a photolithographic process which reveals the regions of zinc diffusion, and may extend somewhat further. Further stages in the fabrication are then similar to those used in the first method.

A potential disadvantage of both the above described methods of manufacture is that the silica masking layer 36 has been retained in order to restrict the current flow in the upper suface to the region immediately above the p-type stripe in the active layer, and this layer of silica introduces strain into the underlying semiconductive material.

Figure 3:
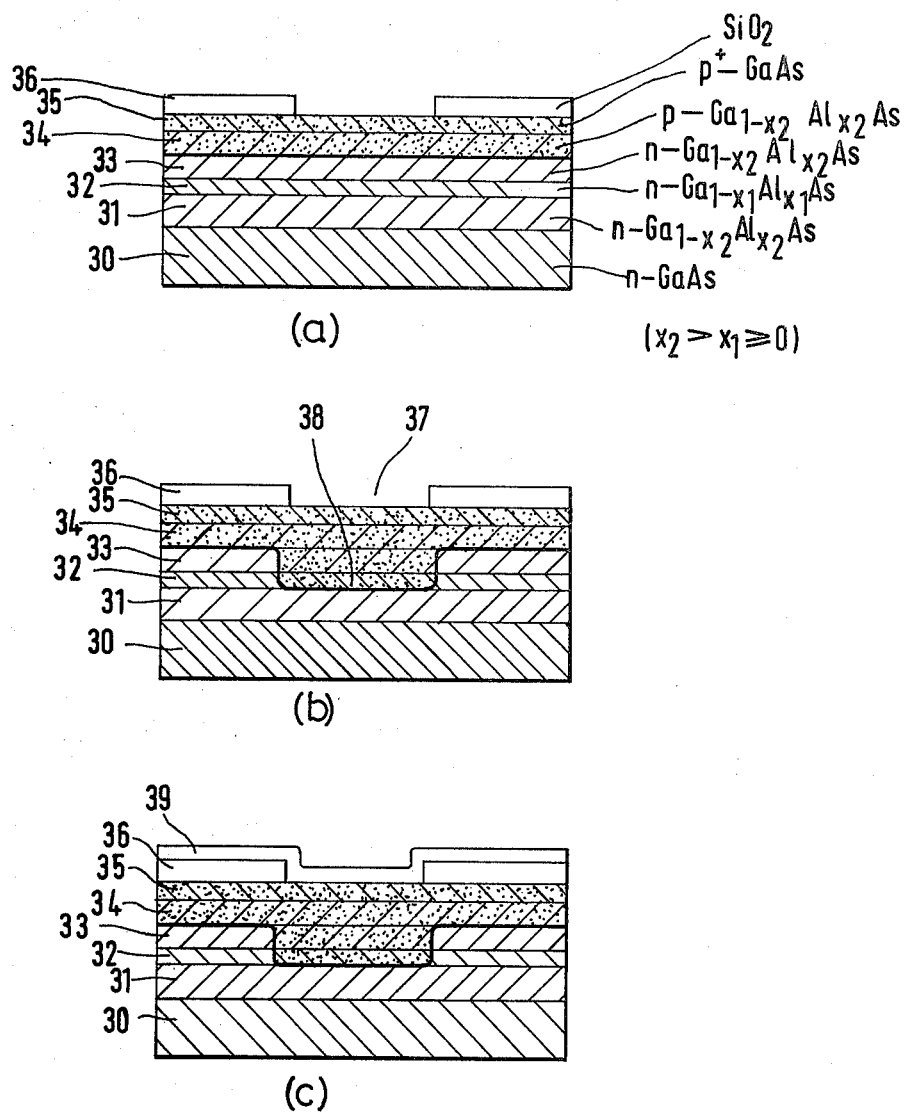
FIGS. 3a to 3c depict successive stages in the manufacture of a laser.
Figure 4:
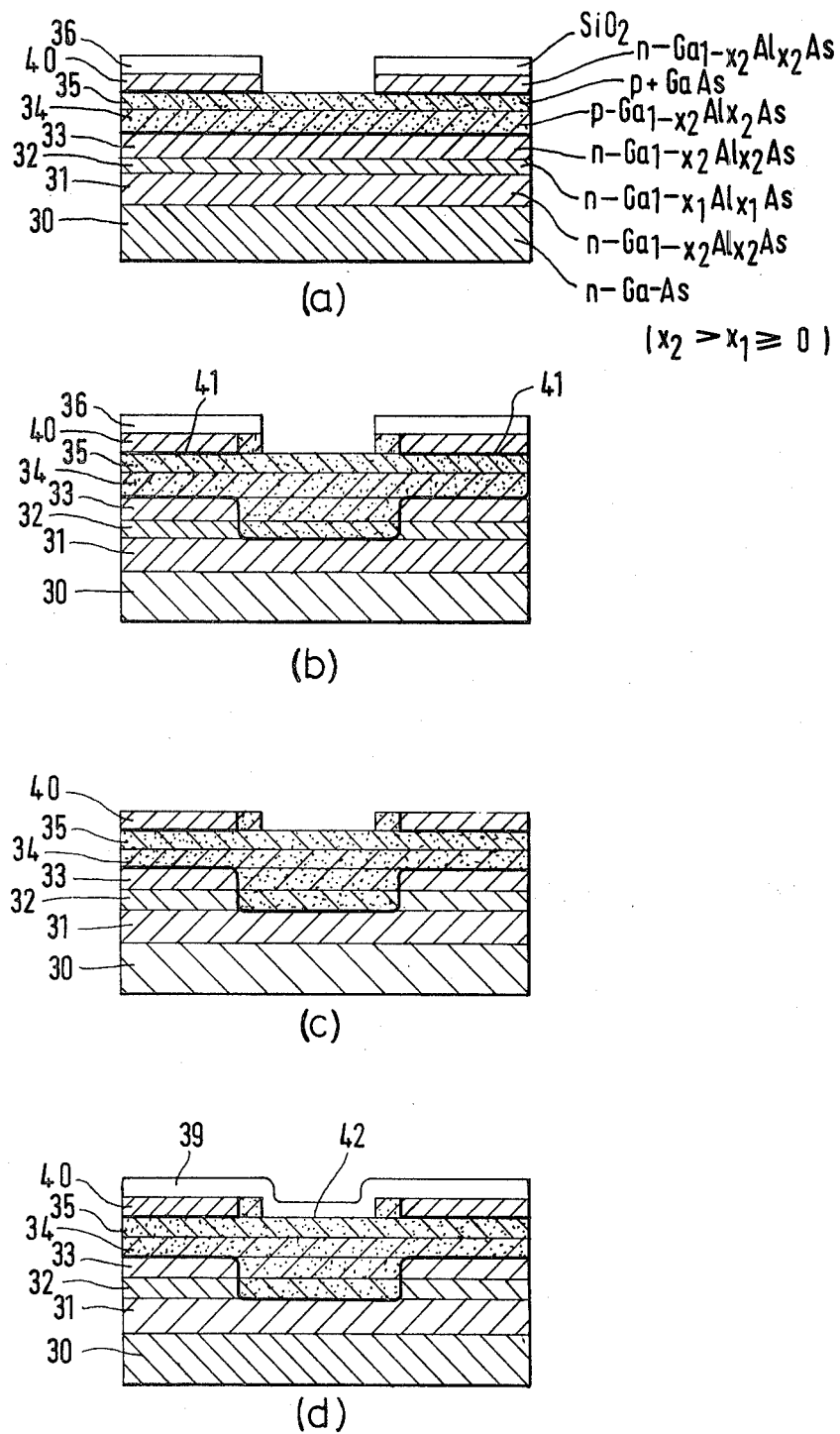
FIGS. 4a to 4d depict successive stages in the manufacture of an alternative form of laser.

The method of manufacture now to be described with reference to FIG. 4 is broadly similar to that previously described with reference to FIG. 3, but in this instance an additional epitaxial layer 40 is provided, enabling the silica to be subsequently removed. Layer 40 is grown on top of layer 35 before the silica layer 36 is deposited. Layer 40 is an n-type layer designed to produce a p-n junction 41 which serves to restrict current flow by being reverse biased during normal operation of the laser. In the region of the etched slot 37 this p-n junction 41 must be eliminated, and this can conveniently be done by making the layer 40 of $Ga_{1-x}Al_xAs$ containing sufficient aluminium arsenide to be attacked by the hydrofluoric acid etchant used for etching the slot 37 (FIG. 4a). The same zinc diffusion process previously described with particular reference to FIG. 3b is now performed on this slice (FIG. 4b).

Next the silica masking layer 36 is removed (FIG. 4c), and this can conveniently be achieved by plasma etching in, for instance, sulphur hexafluoride. A convenient form of apparatus for this plasma etching is that described in U.K. Pat. No. 1,461,636. Any residue left from the plasma etching may be cleaned off by immersing the slice in bromine methanol and rinsing in methanol.

Finally the metal top contact layer 39 is deposited by evaporation on to the top surface (FIG. 4d). When the laser is in operation the p-n junction is forward biased, but the regions of the p-n junction 42 are reverse biased, and hence current flow from the top contact into the underlying semiconductive material is confined to the stripe region 42 where the metal contact is in contact with p-type material.

We claim:

1. A method of making a double heterostructure injection laser of III–V material, the method including the steps of:

forming by epitaxial growth a double heterostructure wherein an active layer of semiconductor material is sandwiched between upper and lower layers of higher band-gap semiconductor material, and wherein the upper layer is provided with a p-n junction dividing a lower part having the same conductivity type as that of the active layer and the lower layer from an upper part having the opposite conductivity type;

growing a layer of semiconductor material of the opposite conductivity than that of the upper part on upper layer, thereby producing a p-n junction which restricts current flow upon being reverse biased during the operation of the laser;

delineating a stripe on the upper surface of the semiconductive material; and diffusing through said stripe a conductivity type determining dopant of the type opposite that of the active layer and of greater mobility than that used in the provision of the three layers of the heterostructure until the region of the p-n junction underlying the stripe is translated downwardly halting at the heterojunction between the active layer and the lower layer.

2. A method as claimed in claim 1 wherein the laser material is $Ga_{1-x}Al_xAs$, where $x \geq 0$.

3. A method as claimed in claim 1 wherein the laser material is $Ga_{1-x}In_xAs$, where $x \geq 0$.

4. A method as claimed in claim 1 wherein the laser material is $Ga_{1-x}In_xAs_{1-y}P_y$, where x24 0 and $y \geq 0$.

5. A method as claimed in claim 1 wherein the dopant diffused through strips is zinc.

6. A method as claimed in claim 1, 2, 3, 4 or 5 wherein the stripe is delineated by depositing a porous layer of silicon dioxide on the surface of the semiconductive material and by selectively removing portions of said layer to leave a residual strip of the porous material, and wherein diffusion through said stripe on the surface of the semiconductive material is from a source of the dopant contained in the pores of the strip, said dopant having been deposited in the pores of the layer prior to the removal of the portions thereof to form said strip.

* * * * *